United States Patent
Iravani et al.

(10) Patent No.: US 9,673,319 B2
(45) Date of Patent: Jun. 6, 2017

(54) POWER SEMICONDUCTOR TRANSISTOR WITH IMPROVED GATE CHARGE

(71) Applicants: KINETIC TECHNOLOGIES, San Jose, CA (US); SILICON FIDELITY, INC, Cupertino, CA (US)

(72) Inventors: Farshid Iravani, Cupertino, CA (US); Jan Nilsson, Sunnyvale, CA (US)

(73) Assignees: KINETIC TECHNOLOGIES, Sunnyvale, CA (US); SILICON FIDELITY, INC., Cupertino, CA (US)

( * ) Notice: Subject to any disclaimer, the term of this patent is extended or adjusted under 35 U.S.C. 154(b) by 0 days.

(21) Appl. No.: 15/066,946

(22) Filed: Mar. 10, 2016

(65) Prior Publication Data
US 2016/0197180 A1    Jul. 7, 2016

Related U.S. Application Data

(63) Continuation of application No. 14/220,439, filed on Mar. 20, 2014, now Pat. No. 9,306,059.

(51) Int. Cl.
| | |
|---|---|
| *H01L 29/66* | (2006.01) |
| *H01L 29/78* | (2006.01) |
| *H01L 21/762* | (2006.01) |
| *H01L 29/06* | (2006.01) |
| *H01L 29/40* | (2006.01) |
| *H01L 29/423* | (2006.01) |

(Continued)

(52) U.S. Cl.
CPC .... *H01L 29/7816* (2013.01); *H01L 21/76202* (2013.01); *H01L 29/0649* (2013.01); *H01L 29/0653* (2013.01); *H01L 29/1083* (2013.01); *H01L 29/1095* (2013.01); *H01L 29/402* (2013.01); *H01L 29/4238* (2013.01); *H01L 29/66681* (2013.01); *H01L 29/7835* (2013.01); *H02M 3/156* (2013.01); *H01L 29/1045* (2013.01)

(58) Field of Classification Search
None
See application file for complete search history.

(56) References Cited

U.S. PATENT DOCUMENTS

| | | |
|---|---|---|
| 9,306,059 B2 * | 4/2016 | Iravani ................ H01L 29/7816 |
| 2008/0173956 A1 | 7/2008 | Bhalla et al. |
| 2008/0191275 A1 | 8/2008 | Khemka et al. |

(Continued)

OTHER PUBLICATIONS

Iravani, Farshid, "A Power Semiconductor Transistor with Improved Gate Charge", printed Dec. 18, 2013 (11 pages).

(Continued)

*Primary Examiner* — Daniel Whalen

(57) ABSTRACT

A slotted gate power transistor is a lateral power device including a substrate, a gate dielectric formed over the substrate, a channel region in the substrate below the gate dielectric and gate electrode layer formed over the gate dielectric. The gate electrode layer overlaps the gate dielectric above the channel region, an accumulation region, and a drift region below an oxide filled shallow trench isolation (or STI) or locally oxidized silicon (LOCOS) region. The slotted gate power transistor includes one or more slots or openings on the gate electrode layer over the accumulation region. Electrical connectivity is maintained over the entire gate electrode layer without external wiring.

16 Claims, 8 Drawing Sheets

(51) Int. Cl.
*H02M 3/156* (2006.01)
*H01L 29/10* (2006.01)

(56) References Cited

U.S. PATENT DOCUMENTS

| | | |
|---|---|---|
| 2011/0115018 A1 | 5/2011 | McGregor |
| 2012/0098062 A1* | 4/2012 | Pendharkar ......... H01L 29/0653 257/337 |
| 2012/0112274 A1 | 5/2012 | Yamada |
| 2015/0270389 A1 | 9/2015 | Iravani et al. |

OTHER PUBLICATIONS

Non-Final Office Action dated Mar. 25, 2015, issued in related U.S. Appl. No. 14/220,439 (10 pages).
Final Office Action dated Jun. 30, 2015, issued in related U.S. Appl. No. 14/220,439 (10 pages).
Notice of Allowance dated Nov. 24, 2015, issued in related U.S. Appl. No. 14/220,439 (9 pages).

* cited by examiner

US 9,673,319 B2

POWER SEMICONDUCTOR TRANSISTOR WITH IMPROVED GATE CHARGE

CROSS REFERENCE TO RELATED APPLICATIONS

This application is a continuation of U.S. Non-provisional patent application Ser. No. 14/220,439, filed on Mar. 20, 2014, the content of which is expressly incorporated herein by reference in its entirety.

FIELD

The present disclosure generally relates to a technical field of semiconductor devices, and particularly to lateral diffusion metal-oxide-semiconductor field effect transistors (LDMOSs) having a slotted gate structure and methods of manufacturing the same.

BACKGROUND

Voltage regulators, such as DC to DC converters, are used to provide stable voltage sources for electronic systems. Efficient DC to DC converters are particularly needed for low power devices. One type of DC-to-DC converters is a switching voltage regulator. A switching voltage regulator generates an output voltage by alternately coupling and decoupling an input DC voltage source with a load. The coupling and decoupling action can be performed by a switch, while a low pass filter comprising a capacitor and an inductor can be used to filter the output of the switch to provide a DC output voltage.

FIG. 1 shows an example implementation of a "buck" type switching regulator, which can perform a DC-DC down conversion. Referring to FIG. 1, circuit 100 includes a voltage source 103, a switching regulator 102 and a load 113. Switching regulator 102 is coupled to the voltage source 103 through an input terminal 114. Switching regulator 102 is also coupled to the load 113, which can be another electronic circuit that draws current, via an output terminal 112. Switching regulator 102 includes a switching circuit 116, which serves as a power switch for alternately coupling and decoupling input terminal 114 to an intermediate terminal 109. Switching circuit 116 includes a first transistor 107 and a second transistor 108. Typically both transistors 107 and 108 can be implemented as metal oxide semiconductor field effect transistor (MOSFETs). Transistor 107 has a drain connected to input terminal 114, a source connected to an intermediate terminal 109, and a gate connected to a control line 105. Transistor 108 has a drain connected to intermediate terminal 109, a source connected to a low voltage potential 115 (e.g. a ground), and a gate connected to a control line 106.

Switching regulator 102 includes a controller 104 to control the operation of switching circuit 116 via control lines 105 and 106. Switching regulator 102 also has an output filter 117, which includes an inductor 110 connected between intermediate terminal 109 and output terminal 112, and a capacitor 111 connected in parallel with load 113. Controller 104 causes switching circuit 116 to alternate between a first conduction period, where first transistor 107 is enabled and second transistor 108 is disabled to bring intermediate terminal 109 to a voltage substantially equal to the input voltage, and a second conduction period, where first transistor 107 is disabled and second transistor 108 is enabled to bring intermediate terminal 109 to a voltage substantially equal to that of low voltage potential 115. This results in a rectangular waveform, which toggles substantially between input voltage and a voltage equal to voltage potential 115, at intermediate terminal 109. Intermediate terminal 109 is coupled to output terminal 112 via output filter 117. Output filter 117 converts the rectangular waveform at intermediate terminal 109 to a substantially DC voltage at output terminal 112. The magnitude of the output DC voltage at terminal 112 depends on the duty cycle of the rectangular waveform at intermediate terminal 109.

With widespread use of BCD (Bipolar-CMOS-DMOS) technology, it is common to integrate controller 104, switching circuit 116, as well as high precision feedback circuit (not shown in FIG. 1) on the same chip. In most monolithically integrated switching regulators with the input operating range of 10 to 200 V, lateral double diffused MOSFET (LDMOS) power devices are used as switch elements.

FIG. 2 illustrates a perspective view of a conventional LDMOS device. As shown in FIG. 2, LDMOS device 200 includes a substrate 202, which is doped with either a P-type or N-type material. On top of substrate 202, device 200 has a body region 203, which is doped with the same type of material as substrate 202. Device 200 also includes a drift region 208, which is doped with an opposite type of material to body region 203 (e.g., doped with N-type if body region 203 is P-type). An isolation region 205, which can be an oxide filled trench such as a shallow trench isolation (STI) region, is formed within drift region 208. Device 200 also includes a source region 206 and a drain region 209, each of which is doped with an opposite type of material to body region 203. Drain is accessed through a drain terminal 215 that is coupled to drain region 209. Device 200 also includes a body contact region 204 abutting source region 206. The abutting regions 204 and 206 are doped with opposite types of materials. Regions 204 and 206 are tied together with a shared contact that is accessed through a body/source terminal 214. Device 200 also includes a gate 201, which includes a gate electrode layer 207, for example, made of polysilicon, a gate terminal 216, and an insulation layer 220, such as silicon dioxide, below gate electrode layer 207. Insulation layer 220 overlaps with region 211 to form the channel, and overlaps with regions 202 and 212 to form an accumulation, transition or neck region. In some embodiments, insulation layer 220 extends from the edge of source region 206 to overlap isolation region 205. The overlapping region is typically called the field plate region (denoted 213 in FIG. 2).

With the configuration shown in FIG. 2, applying a bias voltage of the right polarity to the gate terminal 216 can induce a charge-carrying channel to be formed, in a process known as inversion, at the region 211 under the gate oxide where gate 201 overlaps body region 203. Terminal 214 can act as the source of the LDMOS device. Flow of current from drain to source can be initiated by the application of a bias voltage to drain terminal 215. As the device is turned on, channel inversion charges from the channel 211 flows through transition region 212 and drift region 208 under isolation region 205, to drain region 209, and then out of drain terminal 215.

In the LDMOS device 200 in FIG. 2, a high off-state drain-source voltage can be tolerated by the drift region 208 which is separated from the channel by the accumulation or the transition region. Transition region helps optimize the device on-resistance and breakdown. However, since the transition region is over-laid by the gate oxide, which is typically thin, the transition region introduces considerable Miller capacitance and constitutes a significant portion of the overall gate charge leading to large switching losses in converter circuits. There are prior attempts to mitigate the Miller capacitance. For example, U.S. Patent Application Publication No. 2011/0115018 to McGregor (hereinafter "McGregor"), filed on Nov. 13, 2009, entitled "MOS Power Transistor," introduces a split-gate structure. Although the technique in McGregor reduces the gate area over the drift region and the transition region, the remaining field plate (formed by splitting the gate) in McGregor requires extra wire connection to the source. This complicates internal device wiring and introduces extra output capacitance by coupling the drain to the field plate and the source.

Hence, there is a need for a technique to reduce the gate capacitance of power MOSFETs, especially for LDMOS devices, which neither requires extra wiring without addition of extra device output capacitance as it attempts to reduce the input capacitance.

SUMMARY OF THE DISCLOSURE

Additional aspects and advantages of embodiments of present disclosure will be given in part in the following descriptions, become apparent in part from the following descriptions, or be learned from the practice of the embodiments of the present disclosure.

According to some embodiments, a transistor includes a substrate, an insulation layer on the substrate and a gate electrode layer on the insulation layer, a first terminal region, a second terminal region, a channel region below the insulation layer, and an accumulation region between the second terminal region and the channel region. The gate electrode layer includes one or more openings over the accumulation region. The transistor further comprises a drift region below the insulation layer. In some embodiments, the transistor further comprises an isolation region below the insulation layer. In some embodiments, the isolation region includes a shallow trench isolation (STI) region or a region formed by local oxidation of silicon (LOCOS). In some embodiments, the gate electrode layer of the transistor further comprises one or more openings over the isolation region. In some embodiments, the openings are defined within the gate electrode layer. In some embodiments, all areas on the gate electrode layer of the transistor are electrically connected without external wiring.

According to some embodiments, a transistor comprises a substrate, an insulation layer on the substrate and a gate electrode layer on the insulation layer, a first terminal region, a second terminal region, a body region below the insulation layer and adjacent to the first terminal region, a drift region below the insulation layer and adjacent to the second terminal region, and an isolation region on the drift region and adjacent to the second terminal region. The gate electrode layer includes one or more openings above the area between the body region and the isolation region. In some embodiments, the isolation region includes a shallow trench isolation (STI) region. In some embodiments, the isolation region includes a region formed by local oxidation of silicon (LOCOS). In some embodiments, the gate electrode layer of the transistor further comprises one or more openings above the isolation region.

According to some embodiments, a method for making a transistor comprises doping a first region (e.g., body region) and a second region (e.g., drift region) in a substrate, forming an isolation region in the second region, depositing an insulation layer on the substrate, depositing a gate electrode layer on the insulation layer, and etching one or more openings on the gate electrode layer. The openings overlap at least with part of the substrate where the second region is formed. In some embodiments, the method further comprises doping an area in the first region to form a source region and doping an area in the second region to form a drain region. In some embodiments, the method further comprises blocking the one or more openings to prevent dopants from entering into the openings while doping an area in the first region to form a source region and doping an area in the second region to form a drain region. In some embodiments, the formation of the isolation region in the second region comprises etching a trench and filling the trench with oxide to form the isolation region. In some embodiments, the formation of the isolation region in the second region comprises growing oxide at a selected area to form the isolation region. In some embodiments, one or more openings are formed over at least a portion of the second region between the first region and the isolation region. In some embodiments, the method further comprises etching one or more openings on the gate electrode layer over the isolation region.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
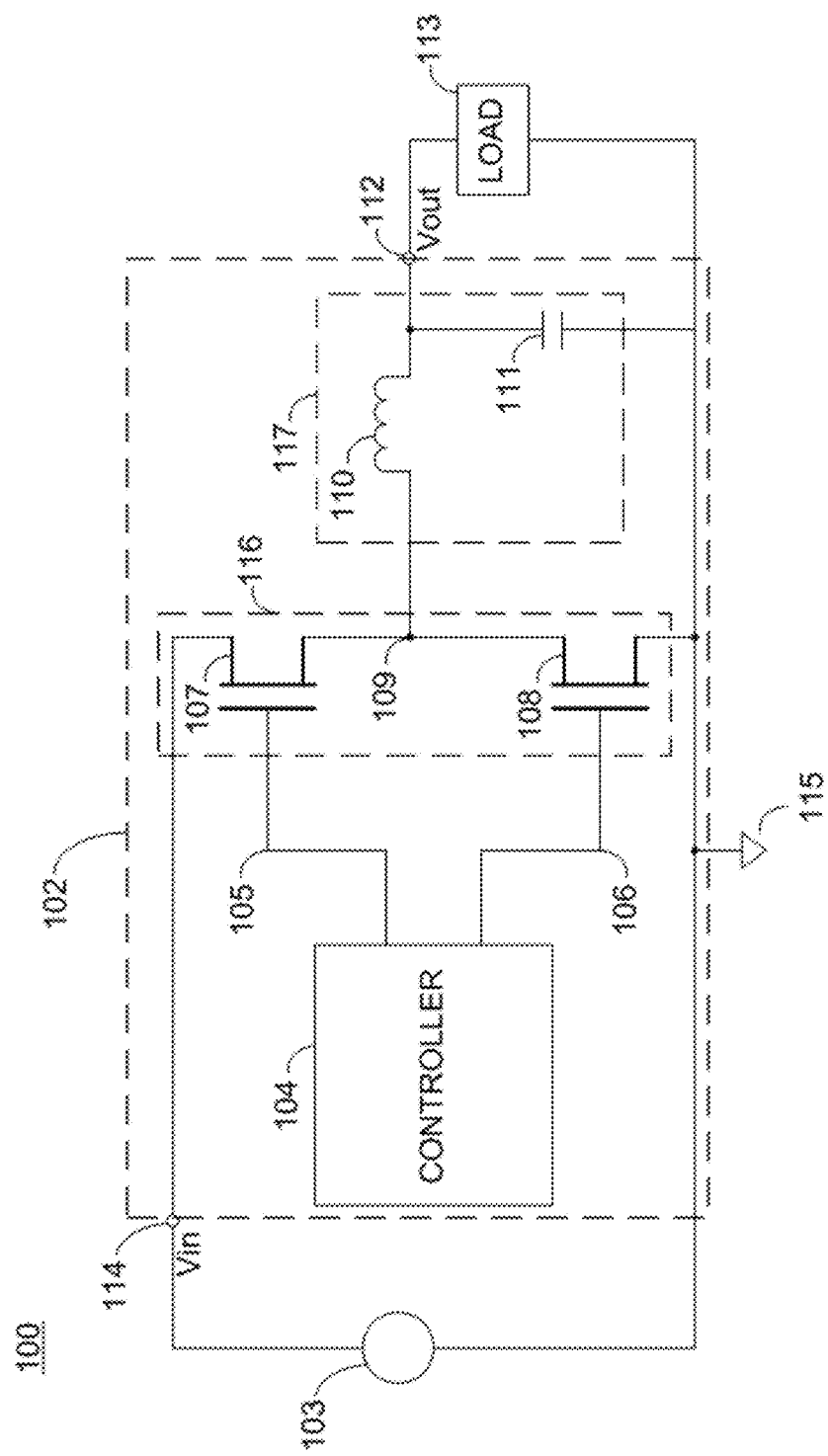
FIG. 1 is a block diagram of a buck switching regulator in the prior art.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions. In this regard, directional terminology, such as "top," "bottom," "front," "back," "leading," "trailing," etc., is used with reference to the orientation of the figure(s) being described. Because components of embodiments of the present disclosure can be positioned in a number of different orientations, the directional terminology is used for purposes of illustration and is in no way limiting. It is to be understood that other embodiments may be utilized and structural or logical changes, including changes in the order of process steps, may be made without departing from the scope of the present disclosure.

The description of the embodiments is only exemplary, and is not intended to be limiting.

Figure 3:
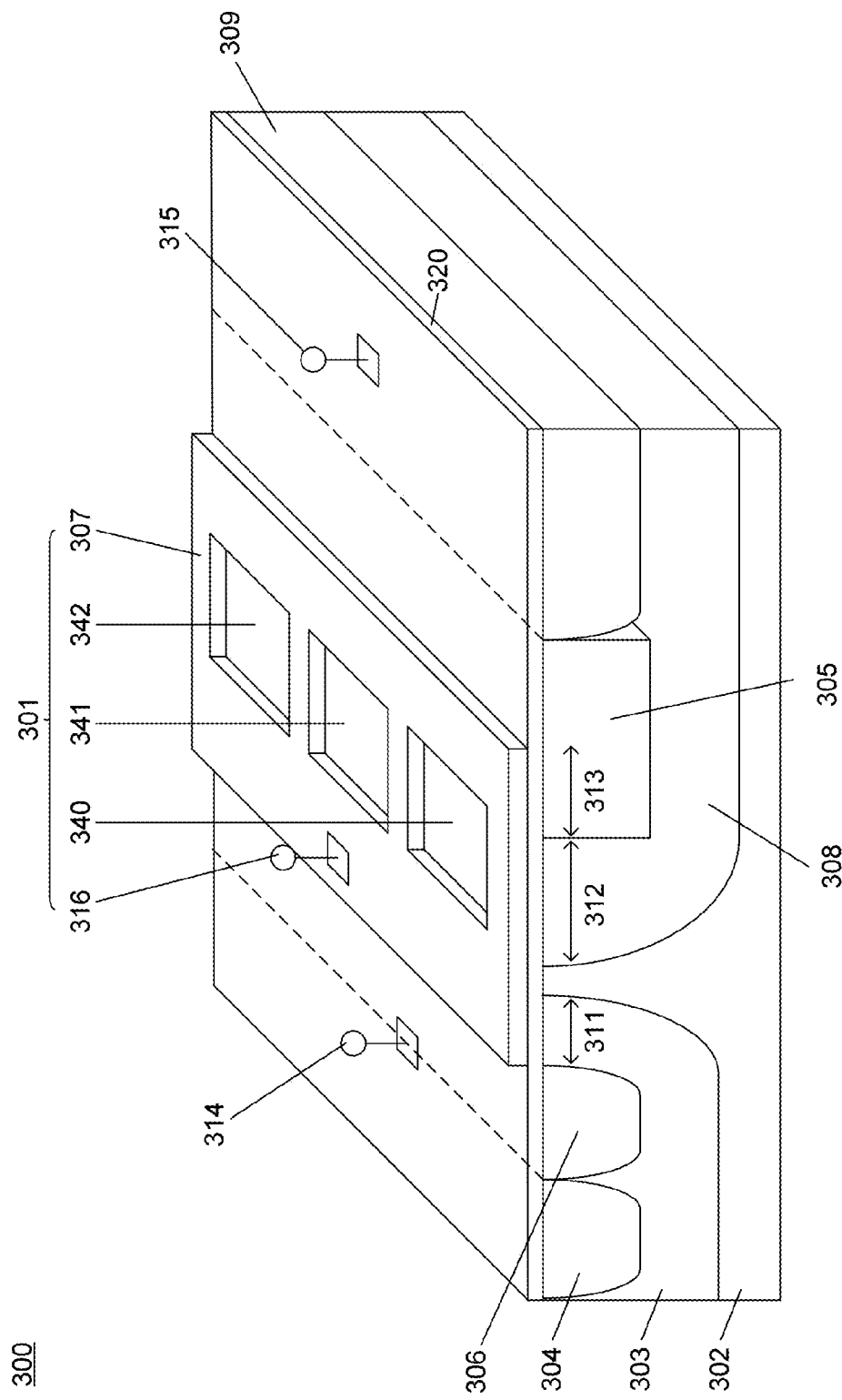
FIG. 3 illustrates a perspective view of a slotted gate LDMOS device, according to an embodiment of the present disclosure.

FIG. 3 illustrates a perspective view of a slotted gate LDMOS 300 according to an embodiment of the present disclosure. As shown in FIG. 3, device 300 includes a substrate 302 which may be doped with either a P-type or an N-type material. On top of substrate 302, device 300 includes a body region 303 which can be doped with the same type of material as substrate 302. Device 300 also includes a drift region 308, which can be doped with an opposite type of material to body region 303 (e.g., doped with N-type if body region 303 is P-type). An isolation region 305, which, in some embodiments, can be a shallow trench insulation (STI) filled with oxide, can be formed within drift region 308. Device 300 may also include a first terminal region and a second terminal region, e.g., source and drain regions 306 and 309, each of which is doped with an opposite type material to body region 303. Device 300 may also include a body contact region 304 abutting source region 306. Body contact region 304 and source region 306 are doped with opposite types of materials. Drain can be accessed through a drain terminal 315, which is coupled to a drain region 309, while body contact region 304 and source region 306 can be tied together with a shared contact that can be accessed through a body/source terminal 314. Device 300 also includes a gate 301, which includes a gate electrode layer 307 typically made of polysilicon, a gate terminal 316, and an insulation layer 320, such as silicon dioxide, below gate electrode layer 307. In some embodiments, insulation layer 320 may extend to the drain and source regions. Alternatively, insulation layer 320 may cover the same area as the gate electrode layer 307, or extend to anywhere between the area covered by gate electrode layer 307 and the drain and source regions. Insulation layer 320 overlaps with region 311 to form the channel, and overlaps with regions 302 and 312 to form the accumulation, transition or neck region. In some embodiments, gate 301 may overlap with at least part of regions 303, 302, 308, and 305. The portion of gate 301 that overlaps with STI region 305 can be called a field plate region (denoted as 313 in FIG. 3).

In some embodiments, device 300 may be an N-channel LDMOS, with body region 303 and body contact region 304 doped with a P-type material, while drift region 308, source region 306, and drain region 309 are doped with an N-type material. In some other embodiments, device 300 may be a P-channel LDMOS, with body region 303 and body contact region 304 doped with an N-type material, while drift region 308, source region 306, and drain region 309 are doped with a P-type material.

As shown in FIG. 3, device 300 may also include a channel region 311 in body region 303 underneath gate 301. When a voltage is applied to gate 301 at gate terminal 316, a conducting channel can be formed in channel region 311. Terminal 314 can act as the source of device 300. Flow of current from drain to source can be initiated by the application of a bias voltage to drain terminal 315. As the device is turned on, channel inversion charges from the channel 311 can flow through transition region and drift region 308 under STI region 305, to drain region 309, and then out of drain terminal 315.

In some embodiments, gate 301 may include openings 340, 341, and 342 in gate electrode layer 307 over region 312. As shown in FIG. 3, in some embodiments, all areas of gate electrode layer 307 are connected without extra and external wiring. In other words, in the exemplary embodiment shown in FIG. 3, no areas on gate electrode layer 307 are separated from the remaining areas that would require extra wire connections. In some exemplary embodiments, openings 340, 341, and 342 are defined within the gate electrode layer 307, and do not extend to the edges of gate electrode layer 307. In some other embodiments, openings 340, 341, and 342 are defined within gate electrode layer 307, such that the two opposite sides, e.g., the left side and the right side of gate electrode layer 307, are connected. In some embodiments, the openings 340, 341, and 342 may extend over at least part of STI region 305. In some exemplary embodiments, openings 340, 341, and 342 have a substantially square shape. Electrical connectivity is maintained over the entire polysilicon layer without extra and external wiring. A person having ordinary skill in art should understand that other shapes and/or other number of openings can also be used. Since there will be substantially no gate charges in the openings, the Miller capacitance, which includes the parasitic capacitance between gate 301 and the transition region, can be substantially reduced, and switching loss can be substantially reduced as well.

Figure 4:
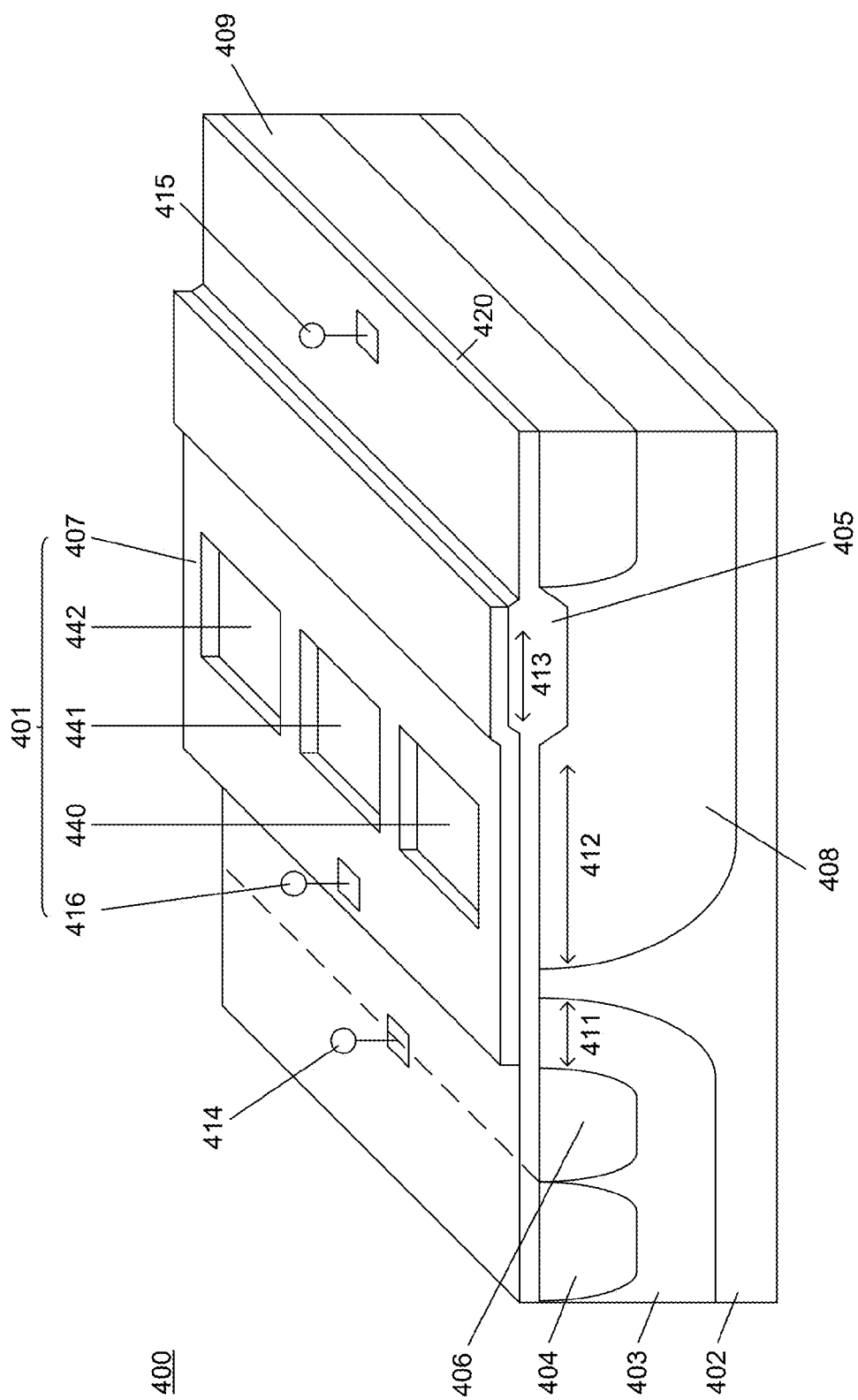
FIG. 4 illustrates a perspective view of a slotted gate LDMOS device, according to another embodiment of the present disclosure.

FIG. 4 illustrates a perspective view of a slotted gate LDMOS 400 according to another embodiment of the present disclosure. As shown in FIG. 4, device 400 includes a substrate 402, which may be doped with either a P-type or an N-type material. On top of substrate 402, device 400 includes a body region 403, which can be doped with the same type of material as substrate 402. Device 400 also includes a drift region 408, which can be doped with an opposite type of material to body region 403 (e.g., doped with N-type if body region 403 is P-type). An isolation region 405 which, in some embodiments, can be formed through local oxidation of silicon (LOCOS), can be formed within drift region 408. Device 400 may also include a first terminal and a second terminal region, e.g. source and drain regions 406 and 409, each of which is doped with an opposite type material to body region 403. Device 400 may also include a body contact region 404 abutting source region 406. The abutting regions 404 and 406 may be doped with opposite types of materials. Drain can be accessed through a drain terminal 415 that couples to drain region 409, while body contact region 404 and source region 406 can be tied together with a shared contact that can be accessed through a body/source terminal 414. Device 400 also includes a gate 401, which includes a gate electrode layer 407, for example, made of polysilicon, a gate terminal 416, and an insulation layer 420, such as oxide, below gate electrode layer 407. Insulation layer 420 overlaps with region 411 to form the channel, and overlaps with regions 402 and 412 to form the accumulation, transition or neck region. In some embodiments, gate 401 may overlap with at least part of regions 403, 402, 408, and 405. The portion of gate 401 which overlaps with LOCOS region 405 can be called a field plate region (denoted as 413 in FIG. 4).

In some other embodiments, device 400 may be an N-channel LDMOS, with body region 403 and body contact 404 doped with a P-type material, while drift region 408, source region 406 and drain region 409 are doped with an N-type material. In some other embodiments, device 400 may be a P-channel LDMOS, with body region 403 and body contact region 404 doped with an N-type material, while drift region 408, source region 406 and drain region 409 are doped with a P-type material.

As shown in FIG. 4, device 400 may also include a channel region 411 in body region 403 underneath gate 401. When a voltage is applied to gate 401 at gate terminal 416, a conducting channel can be formed in channel region 411. Terminal 414 can act as the source of device 400. Flow of current from drain to source can be initiated by the application of a bias voltage to drain terminal 415. As the device is turned on, channel inversion charges from the channel 411 can flow through transition region and drift region 408 under LOCOS region 405, to drain region 409, and then out of drain terminal 415.

In some embodiments, gate 401 may include openings 440, 441, and 442 in gate electrode layer 407 over region 412. As shown in FIG. 4, in some other embodiments, all areas of gate electrode layer 407 are connected without extra and external wiring. In other words, in the exemplary embodiment shown in FIG. 4, no areas on gate electrode layer 407 are separated from the remaining areas that would require extra wire connections. In some exemplary embodiments, openings 440, 441, and 442 are defined within the gate electrode layer 407, and do not extend to the edges of gate electrode layer 407. In some other embodiments, openings 440, 441, and 442 are defined within the gate electrode layer 407, such that the two opposite sides, e.g., the left side and the right side of gate electrode layer 407, are connected. In some embodiments, the openings 440, 441, and 442 may extend over at least part of LOCOS region 405. In some exemplary embodiments, openings 440, 441, and 442 have a substantially square shape. Electrical connectivity is maintained over the entire polysilicon layer without extra and external wiring. A person having ordinary skill in art should understand that other shapes and/or other number of openings can also be used. Since there will be substantially no gate charges in the openings, the Miller capacitance, which includes the parasitic capacitance between gate 401 and the transition region, can be substantially reduced, and switching loss can be substantially reduced as well.

Figure 2:
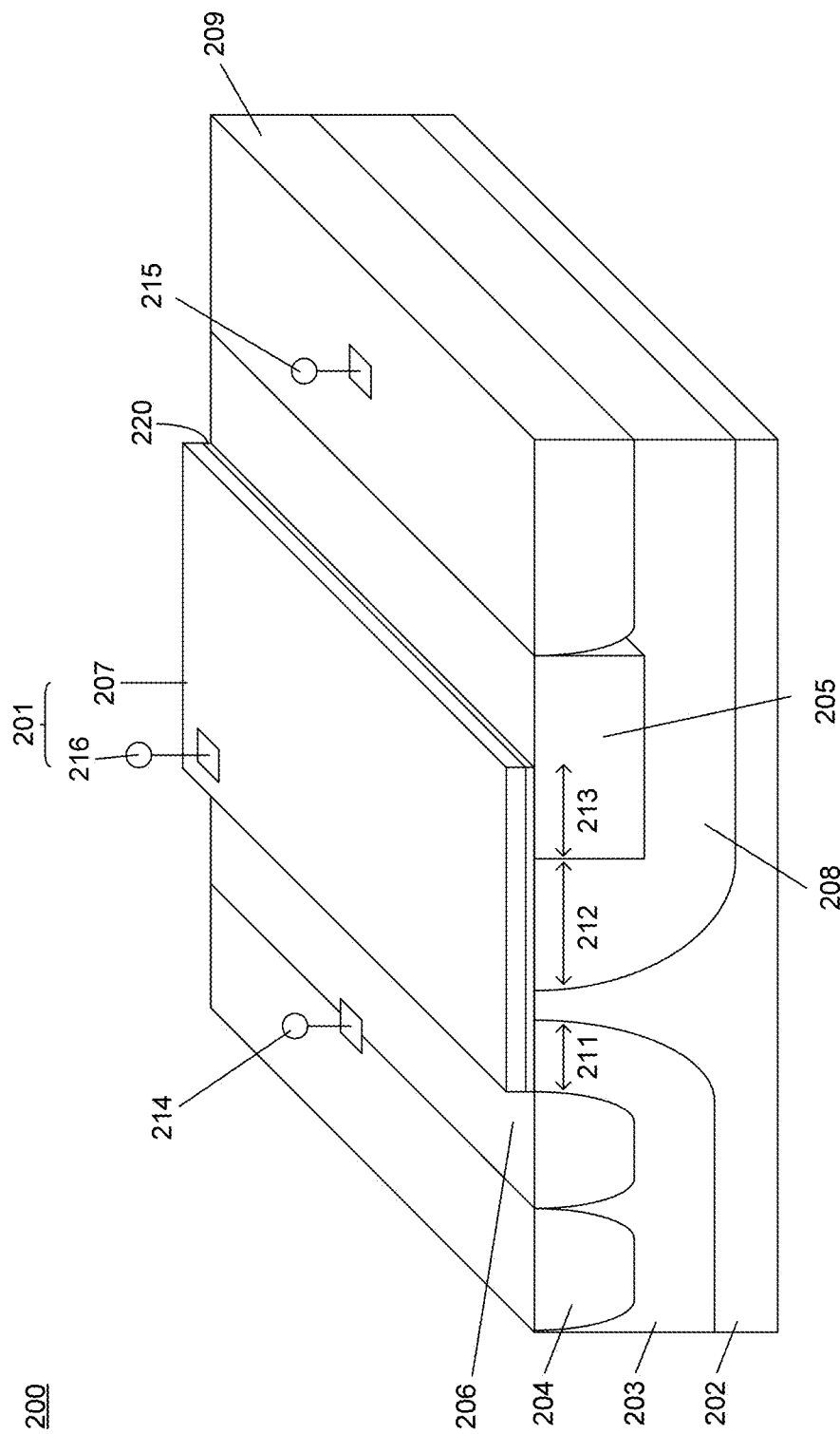
FIG. 2 illustrates a perspective view of a conventional LDMOS device in the prior art.
Figure 5:
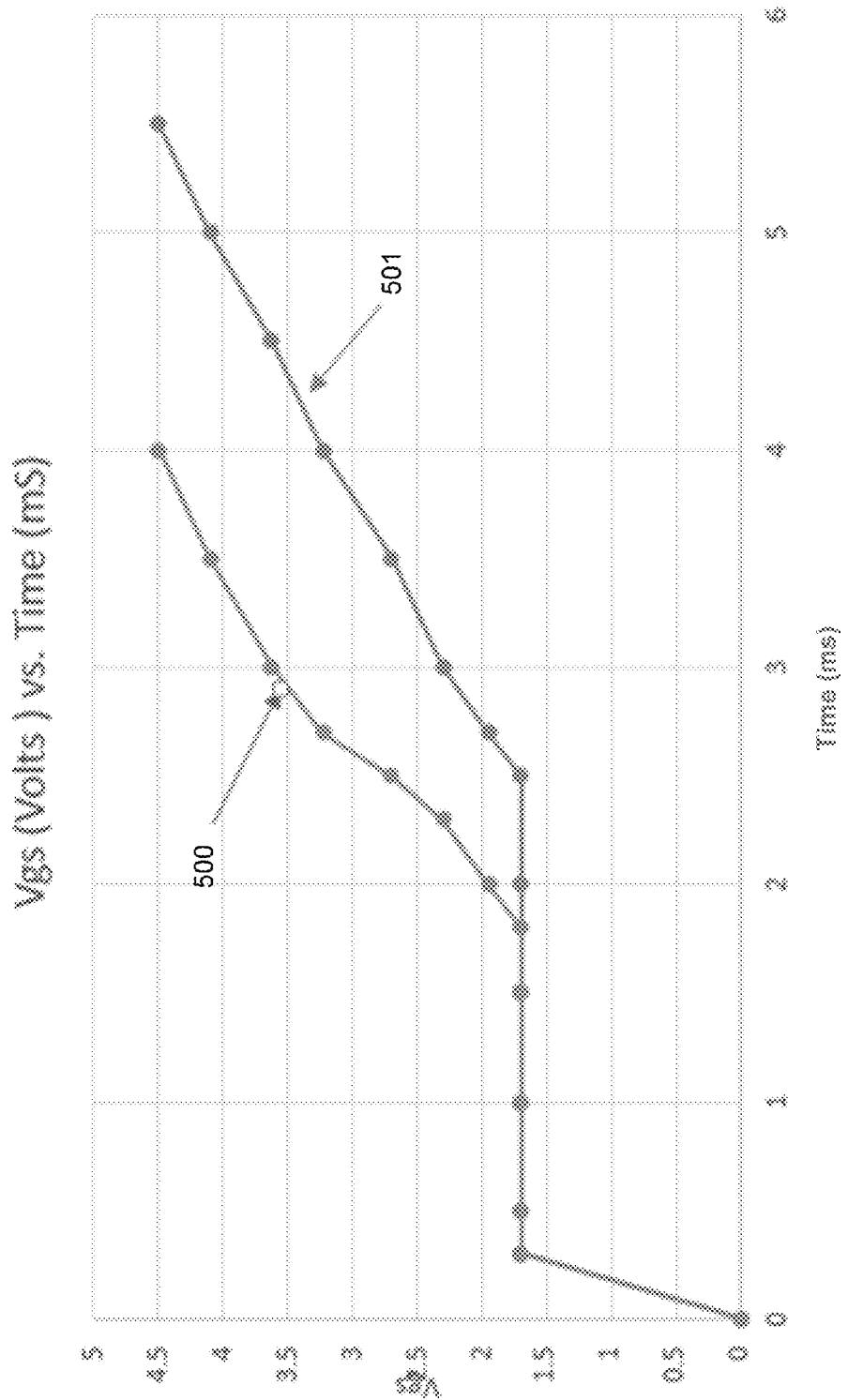
FIG. 5 illustrates the gate charge curves for a conventional LDMOS device, such as that shown in FIG. 2, and for a slotted gate LDMOS according to an embodiment of the present disclosure.

FIG. 5 illustrates a gate charge curve 501 for a conventional LDMOS, such as the one shown in FIG. 2, and a gate charge curve 500 for a slotted gate LDMOS device according to an embodiment of the present disclosure. A gate charge curve shows the variation of the gate voltage of a LDMOS device as it switches. Such a curve can be generated for a standalone LDMOS device by connecting its drain to a nominal supply voltage through a load resistance, its source to a low potential (e.g. ground), and supplying a constant charging current to its gate. The current can be used to charge up the gate capacitance, and the change of gate voltage with time can be recorded. As shown in FIG. 5, both the conventional and the slotted gate devices have a threshold voltage at around 1.7 volt. There are three phases in the gate charge curve. In the first phase, there is a substantially linear increase in the $V_{gs}$ (gate voltage) with respect to time as the gate to source capacitance is being charged up. Once the gate voltage reaches a threshold voltage for channel formation, a second phase begins where the gate to drain Miller capacitance is to be charged up. During the second phase (also known as the plateau phase), $V_{gs}$ is relatively constant, as shown in FIG. 5. The duration of this plateau region, $t_{plateau}$, affects $Q_{gd}$ (amount of charges stored in the Miller capacitance), since the amount of charges stored substantially equals to the product of $t_{plateau}$ and gate charging current $I_g$. As shown in FIG. 5, because of the Miller capacitance reduction, the duration of the plateau region for the slotted gate device is about 0.7 milliseconds shorter than that for the conventional device. The third phase begins as the device starts conduction and the gate to channel inversion capacitance is to be charged up, and $V_{gs}$ resumes increasing. This phase ends once the gate fully reaches its rated value (which is 5 volts in this case) and the device is fully on. The charge-up process stops for the slotted gate device about 1.5 milliseconds earlier than for the conventional device at last due to the reduced gate to drain Miller capacitance, which results in overall reduction in the total gate charge required to fully turn on the gate.

Figure 6:
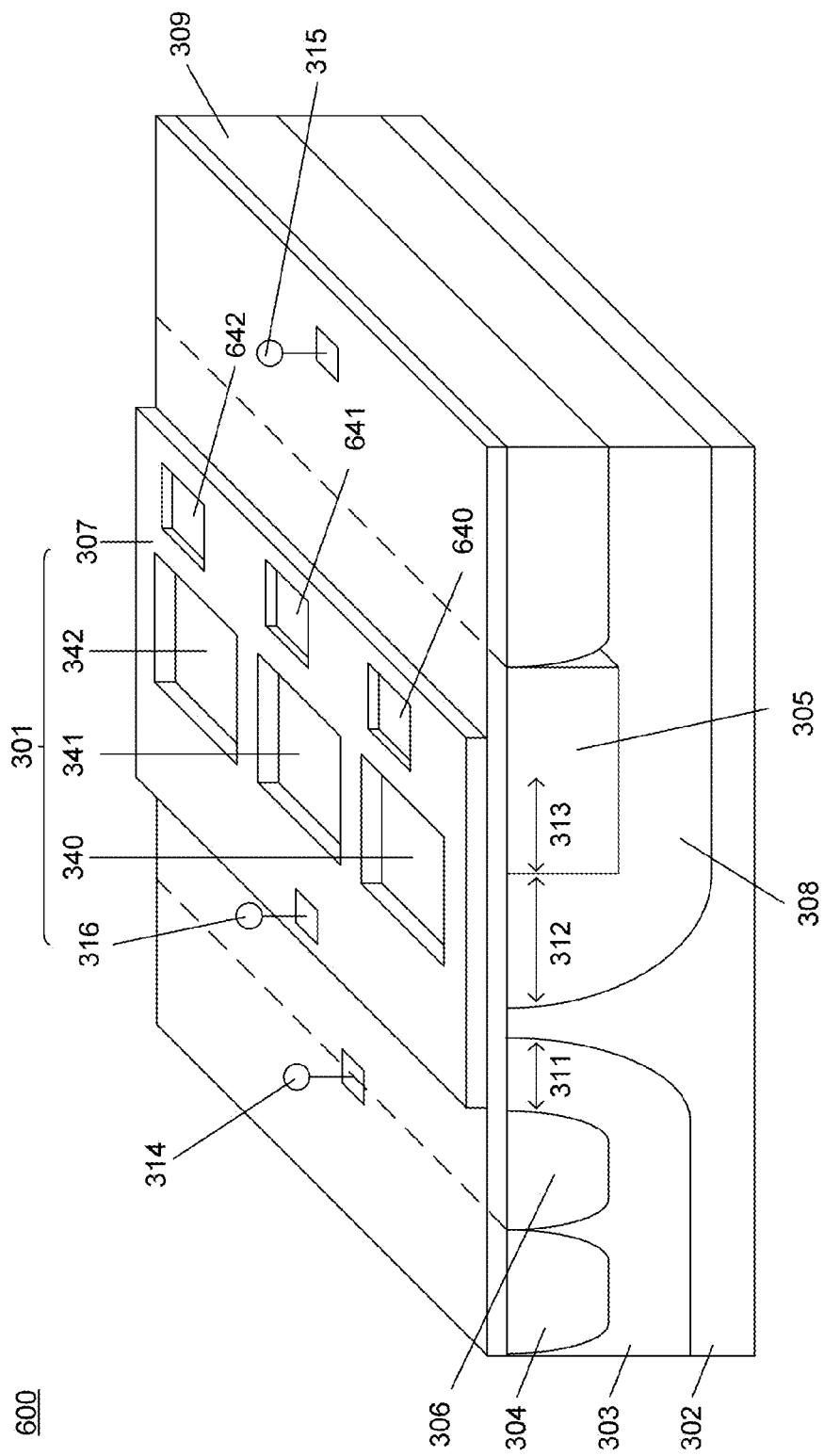
FIG. 6 illustrates a perspective view of a slotted gate LDMOS device, according to another embodiment of the present disclosure.

FIG. 6 shows a perspective view of a slotted gate LDMOS 600 according to another embodiment of the present disclosure. As shown in FIG. 6, the embodiment is similar to that shown in FIG. 3, except that the embodiment in FIG. 6 includes additional openings 640, 641, and 642 on the polysilicon layer 307 over the STI region 305. The same elements in FIGS. 6 and 3 are denoted by same reference numerals and are not described.

Figure 7:
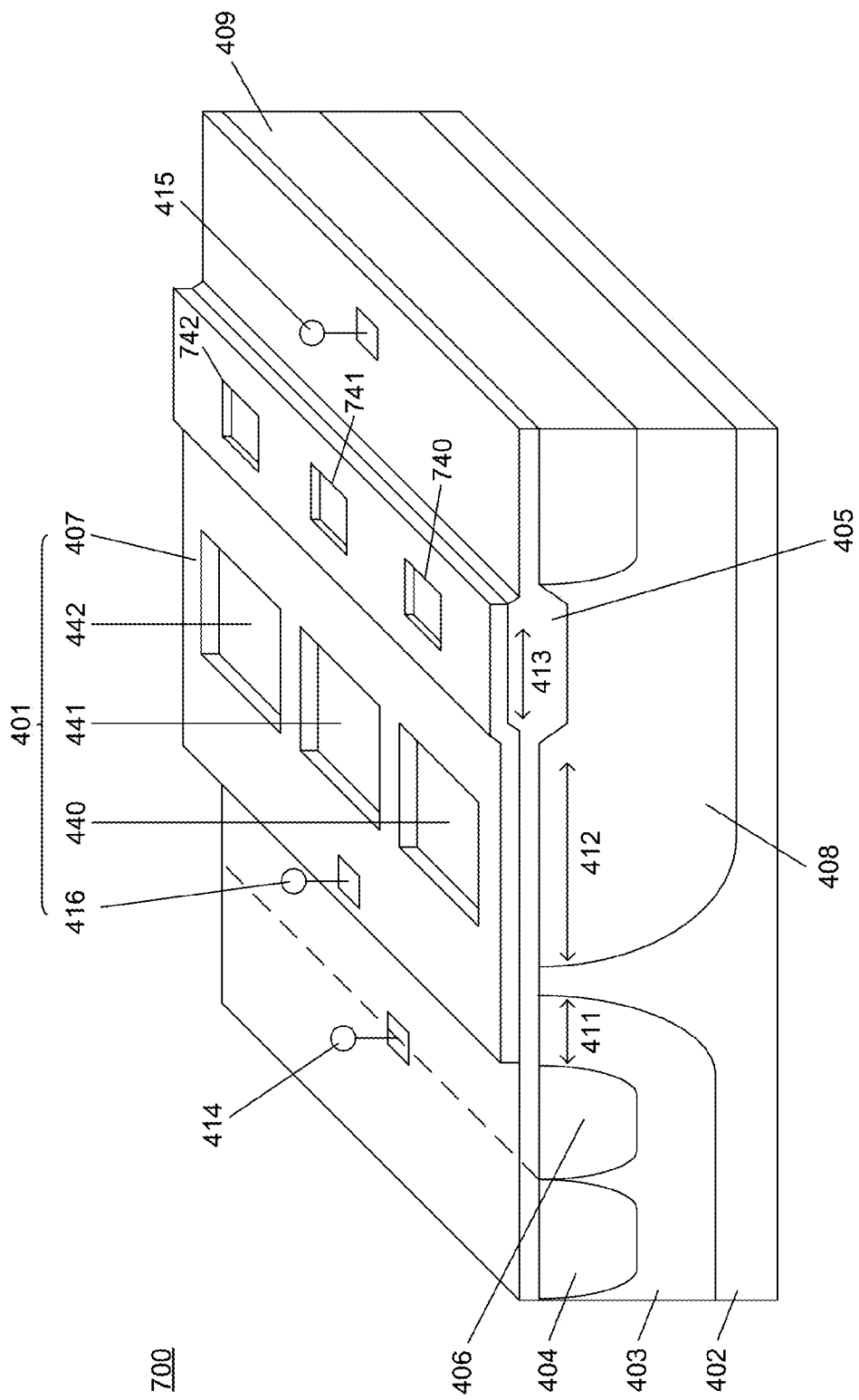
FIG. 7 illustrates a perspective view of a slotted gate LDMOS device, according to a further embodiment of the present disclosure.

FIG. 7 shows a perspective view of a slotted gate LDMOS 700 according to another embodiment of the present disclosure. As shown in FIG. 7, the embodiment is similar to that shown in FIG. 4, except that the embodiment in FIG. 7 includes additional openings 740, 741, and 742 on the polysilicon layer 407 over the LOCOS region 305. The same elements in FIGS. 7 and 4 are denoted by same reference numerals and are not described.

Figure 8:
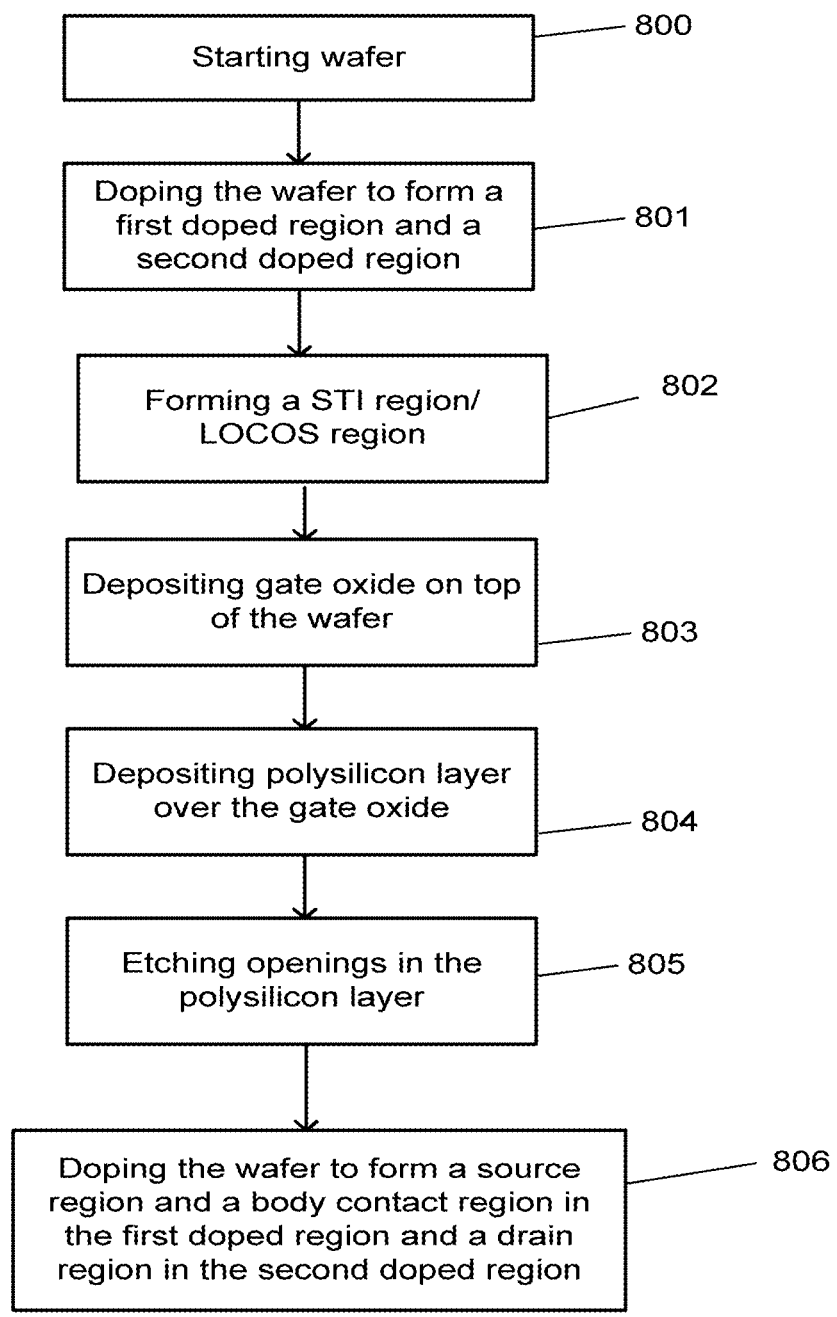
FIG. 8 is a flow diagram illustrating a process for manufacturing an LDMOS device according to an embodiment of the present disclosure.

FIG. 8 is a flow diagram illustrating a process for manufacturing a semiconductor device, such as the LDMOS devices of FIGS. 3-7, according to an embodiment of the present disclosure. As an example, referring to both FIG. 3 and FIG. 8, in step 800, a silicon wafer is prepared, and a substrate is formed by doping it with N-type or P-type material. In step 801, a first doped region and a second doped region are formed. The first doped region can be body region 303, while the second doped region can be drift region 308. In step 802, an STI or LOCOS region can be formed on top of the drift region. For example, the STI region can be formed by etching a trench in the substrate and filling the trench with oxide. The LOCOS region can be formed by growing oxide at a selected region. In step 803, an insulation layer, such as gate oxide, is deposited on top of the wafer. In step 804, a polysilicon layer is deposited on top of the gate oxide to form gate electrode layer 307. In step 805, openings are defined by, e.g., etching, in the gate electrode layer 307 over, for example, transition region 312. In step 806, a source region and a body contact region are formed in the first doped region and a drain region is formed in the second doped region by doping selected areas in the substrate.

The transistor devices illustrated in FIGS. 3-8 can be used to implement transistors 108 and 107 in the "buck" type switching regulator circuit 100 of FIG. 1. On the other hand, a person with ordinary skill in the art should appreciate that the transistor devices illustrated in FIGS. 3-8 can also be used for other applications which may or may not be related to DC-DC switching.

Reference throughout this specification to "an embodiment," "some embodiments," "one embodiment", "another example," "an example," "a specific examples," or "some examples," means that a particular feature, structure, material, or characteristic described in connection with the embodiment or example is included in at least one embodiment or example of the present disclosure. Thus, the appearances of the phrases such as "in some embodiments," "in one embodiment," "in an embodiment," "in another example," "in an example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A transistor, comprising:
  a substrate doped with one of a P-type and N-type material;
  an insulation layer on the substrate and a gate electrode layer having side edges on the insulation layer;
  a first terminal region;
  a second terminal region;
  a channel region below the insulation layer; and
  an accumulation region between the second terminal region and the channel region, at least a part of the accumulation region comprising the other one of the P-type and N-type material, wherein:
   the gate electrode layer includes one or more openings through the gate electrode layer to a top surface of the insulation layer, and
   at least a part of one of the one or more openings directly overlaps with at least a part of the accumulation region.

2. The transistor of claim 1, further comprising a drift region below the insulation layer.

3. The transistor of claim 2, further comprising an isolation region below the insulation layer.

4. The transistor of claim 3, wherein the isolation region includes a single continuous shallow trench isolation (STI) region.

5. The transistor of claim 3, wherein the isolation region includes a region formed by local oxidation of silicon (LOCOS).

6. The transistor of claim 3, wherein the gate electrode layer further comprises one or more openings over the isolation region.

7. The transistor of claim 3, wherein at least a part of one of the one or more openings directly overlaps with at least a part of the isolation region.

8. The transistor of claim 1, wherein all areas on the gate electrode layer are electrically coupled without external wiring.

9. The transistor of claim 1, wherein the one or more openings reduce gate charges and Miller capacitance of the transistor during operation.

10. The transistor of claim 1, wherein the transistor is a lateral diffusion metal-oxide-semiconductor field effect transistor.

11. A transistor, comprising:
  a substrate doped with one of a P-type and N-type material;
  an insulation layer on the substrate and a gate electrode layer having side edges on the insulation layer;
  a first terminal region;
  a second terminal region;
  a body region below the insulation layer and adjacent to the first terminal region;
  a drift region below the insulation layer and adjacent to the second terminal region and doped with the other one of the P-type and N-type material; and
  an isolation region on the drift region and adjacent to the second terminal region, wherein:
   the gate electrode layer includes one or more openings through the gate electrode layer to a top surface of the insulation layer, and
   at least a part of one of the one or more openings directly overlaps with at least a part of an area between the body region and the isolation region.

12. The transistor of claim 11, wherein the isolation region includes a single continuous shallow trench isolation (STI) region.

13. The transistor of claim 11, wherein the isolation region includes a region formed by local oxidation of silicon (LOCOS).

14. The transistor of claim 11, wherein:
  the gate electrode layer includes one or more openings above the isolation region; and
  at least a part of one of the one or more openings directly overlaps with at least a part of the isolation region.

15. A transistor, comprising:
  a substrate doped with one of a P-type and N-type material;
  an insulation layer on the substrate and a gate electrode layer having edges on the insulation layer;
  a first terminal region;
  a second terminal region;
  a channel region below the insulation layer; and
  an accumulation region between the second terminal region and the channel region, at least a part of the accumulation region comprising the other one of the P-type and N-type material, wherein:
   the gate electrode layer includes one or more openings through the gate electrode layer to a top surface of the insulation layer,
   at least a part of one of the one or more openings directly overlaps with at least a part of the accumulation region, and
   the one or more openings are within an area defined by the edges of the gate electrode layer.

16. A transistor, comprising:
  a substrate doped with one of a P-type and N-type material;
  an insulation layer on the substrate and a gate electrode layer having edges on the insulation layer;
  a first terminal region;
  a second terminal region;
  a body region below the insulation layer and adjacent to the first terminal region;
  a drift region below the insulation layer and adjacent to the second terminal region and doped with the other one of the P-type and N-type material; and
  an isolation region on the drift region and adjacent to the second terminal region, wherein:
   the gate electrode layer includes one or more openings through the gate electrode layer to a top surface of the insulation layer,
   at least a part of one of the one or more openings directly overlaps with at least a part of an area between the body region and the isolation region, and
   the one or more openings are within an area defined by the edges of the gate electrode layer.

* * * * *